United States Patent [19]

Mori et al.

[11] Patent Number: 5,233,561
[45] Date of Patent: Aug. 3, 1993

[54] COMPOSITE SEMICONDUCTOR STORAGE DEVICE AND OPERATING METHOD THEREFOR

[75] Inventors: Shinichi Mori; Osamu Ueda, both of Hyogo, Japan

[73] Assignee: Mitsubishi Denki Kabushiki Kaisha, Tokyo, Japan

[21] Appl. No.: 764,680

[22] Filed: Sep. 25, 1991

[30] Foreign Application Priority Data

Sep. 28, 1990 [JP] Japan ................. 2-260707

[51] Int. Cl.$^5$ ............................................. G11C 7/02
[52] U.S. Cl. ................................ 365/210; 365/189.01
[58] Field of Search .................... 365/189.01, 189.03, 365/210, 230.01

[56] References Cited

U.S. PATENT DOCUMENTS

| | | | |
|---|---|---|---|
| 4,757,474 | 7/1988 | Fukushi | 365/210 |
| 4,783,764 | 11/1988 | Tsuchiya | 365/189.05 |
| 4,905,191 | 2/1990 | Arai | 365/210 |
| 5,001,670 | 3/1991 | Slate | 365/189.01 |

FOREIGN PATENT DOCUMENTS 63-157341 1/1990 Japan .

OTHER PUBLICATIONS

Universal Peripheral Interface 8-Bit Slave Microcontroller, Intel (Preliminary), Oct. 1987, pp. 9-54-9-69.

*Primary Examiner*—Eugene R. LaRoche
*Assistant Examiner*—A. Zarabian
*Attorney, Agent, or Firm*—Lowe, Price, LeBlanc & Becker

[57] ABSTRACT

A semiconductor storage device formed on a single chip includes a ROM, a RAM and an input/output port. When a mode setting signal designates a normal mode, access is made to one of the ROM, RAM and input/output port in response to an address signal. The ROM is accessed when the mode setting signal designates a ROM write mode and the address signal designates an address assigned to the ROM. A dummy data is output from a data input/output terminal when the mode setting signal designates the ROM write mode, the address signal designates an address outside an address region assigned to the ROM, and a read signal is applied to the device.

11 Claims, 8 Drawing Sheets

| $C_1$ | IN | OUT | |
|---|---|---|---|
| L | L | FLOATING | OUTPUT DISABLE |
| L | H | FLOATING | |
| H | L | L | |
| H | H | H | |

COMPOSITE SEMICONDUCTOR STORAGE DEVICE AND OPERATING METHOD THEREFOR

BACKGROUND OF THE INVENTION

1. Field of the Invention

The present invention relates to semiconductor storage devices, and more particularly to a composite semiconductor storage device including a programmable memory.

2. Description of the Background Art

Programmable non-volatile semiconductor storage devices includes a UVEPROM (Ultra-Violet ray erasable Electrically reprogrammable Read Only Memory) whose contents are erasable by ultraviolet radiation and are also rewritable, and an EEPROM (Electrically Erasable and Programmable ROM) whose contents are electrically rewritable. These programmable ROMs are used in systems as program storage memories or data storage memories.

A ROM writer 200 as shown in FIG. 9 is used for programming such programmable ROMs.

The ROM writer 200 is connected to a device 300 including a programmable ROM. The ROM writer 200 includes an address generator 210, a data memory 220, a control signal generator 230, a comparing and checking circuit 240, a constant voltage generator 250 and a basic clock generator 260. The basic clock generator 260 applies a basic clock signal to the address generator 210 and control signal generator 230. In response to the basic clock signal, the address generator 210 generates an address signal AD. The control signal generator 230, in response to the basic clock signal, generates control signals such as a chip enable signal $\overline{CE}$ and an output enable signal $\overline{OE}$. The data memory 220 stores data for writing and expected value data. The comparing and checking circuit 240 compares data D read from the device 300 and the expected value data stored in the data memory 220. The constant voltage generator 250 generates a source voltage Vcc, a high voltage for writing Vpp and ground voltage GND.

When programming the device 300, it is first checked whether all the address regions of the ROM in the device 300 are in erased condition. In practice, data are read from all the address regions of the ROM, and are compared in the comparing and checking circuit 240 with expected data "0" or "1" for the erased condition stored in the data memory 220. This is called a blank check.

Next, the data for writing stored in the data memory 220 are written successively into the address regions of the ROM in the device 300. This is called programming.

Finally, the data are read successively from the ROM in the device 300, which are compared in the comparing and checking circuit 240 with the expected value data stored in the data memory 220. It is thereby checked whether the data have been written correctly into the ROM. This is called a verifying process.

In this way, programming is carried out for a device including a programmable ROM.

Marked progress has been made recently in the micro fabrication technique in wafer processing. Further, in order to achieve lightness and compactness, it is desired to minimize the number of components. With this in view, composite ICs have been developed which have a plurality of memories such as a RAM (Random Access Memory) and a ROM, an operational unit and the like integrated on a single chip. FIG. 10 shows a conventional semiconductor storage device as an example of such composite ICs, in which an EPROM and an SPROM (Static Random Access Memory) are integrated on a single chip.

The semiconductor storage device 100a shown in FIG. 10 includes an EPROM (hereinafter called the ROM) 1 and an SRAM (hereinafter called the RAM) 3. An input/output buffer 2 is provided for the ROM 1, and an input/output buffer 4 for the RAM 3. Further, an input/output buffer 5 is provided to act as an I/0 port.

An address buffer/address decoder (hereinafter called the address buffer/decoder) 6 receives an externally applied address signal AD, and outputs an address signal AD1 to the ROM 1 and RAM 3. Further, the address buffer/decoder 6 generates a select signal CSROM for selecting the ROM 1, a select signal CSRAM for selecting the RAM 3, and a select signal CSPORT for selecting the input/output buffer 5 (I/0 port). A control circuit 7 receives externally applied control signals, such as a chip enable signal $\overline{CE}$ and an output enable signal $\overline{OE}$, and generates a read signal RD and a write signal WR. At a time of data writing (programming), a high voltage for writing Vpp is externally applied to the ROM 1.

The input/output buffers 2, 4 and 5 are connected to a common data bus 8. An input/output buffer 9a also is connected to the data bus 8.

The way in which the semiconductor storage device of FIG. 10 operates will be described with reference to FIG. 11 showing waveforms.

The ROM 1, RAM 3 and input/output buffer 5 have their own address regions allocated thereto, respectively. When the address signal AD shows an address in the address region corresponding to the ROM 1, the address buffer/decoder 6 sets the select signal CSROM to "H" and the select signals CSRAM and CSPORT to "L". As a result, the input/output buffer 2 becomes operable. Further, a memory element in the ROM 1 is accessed in accordance with the address signal AD1.

At a data reading time, the control circuit 7 generates the read signal RD. This places the input/output buffer 2 and input/output buffer 9a in output enable state. As a result, the data read from the accessed memory element is output through the input/output buffer 2, data bus 8 and input/output buffer 9a.

At a data writing time, the control circuit 7 generates the write signal RD. This places the input/output buffer 2 and input/output buffer 9a in input enable state. As a result, an externally applied data D is written into the accessed memory element through the input/output buffer 9a, data bus 8 and input/output buffer 2.

When the externally applied address signal AD denotes an address in the address region corresponding to the RAM 3, the select signal CSRAM attains "H" and the select signals CSROM and CSPORT attain "L". As a result, the input/output buffer 4 becomes operable. Further, a memory element in the RAM 3 is accessed in accordance with the address signal AD1. As in the foregoing process, the data stored in the accessed memory element is read and output, or externally applied data D is written into the accessed memory element.

When the address signal AD denotes an address in the address region corresponding to the input/output buffer 5, the select signal CSPORT attains "H" and the select signals CSROM and CSRAM attain "L". As a result, data D applied externally is input to the data bus 8 through the input/output buffer 5, or a data on the data bus 8 is output through the input/output buffer 5. Alternatively, data D applied externally may also be input to the data bus 8 through the input/output buffer 9a, or a data on the data bus 8 output through the input-/output buffer 9a. In this way, the input/output buffer 5 acts as an I/0 port.

If the ROM 1 in the conventional semiconductor storage device 100a has the same storage capacity as a general-purpose ROM already in wide use, the ROM 1 may be programmed using the commercially available ROM writer 200 (programming device) such as shown in FIG. 9.

Chip size of a composite IC such as the semiconductor storage device 100a inevitably becomes large. Further, the number of signals is increased, since varied functions are provided on a single chip. In a composite IC, therefore, the number of terminals differs from that of a general-purpose ROM and so does the package. Under the circumstances, programming of the ROM 1 is achieved by using an appropriate pin-converting adapter to match the specification of ROM writer 200.

However, the ROM 1 mounted in the above semiconductor storage device often has a storage capacity different from that of a general-purpose ROM. For example, a general-purpose ROM has a storage capacity of 32K bytes (1 byte=8 bits) or 64 kbytes, while the ROM 1 mounted in the above semiconductor storage device may have a storage capacity of 20K or 40K bytes. In such a case, the following problem arises when programming the ROM.

The ROM writer 200 effects write and read controls suited to a general-purpose ROM having a larger storage capacity than the ROM 1 mounted on the above semiconductor storage device 100a. Consequently, when a blank check is carried out, access is made also to address regions other than that corresponding to the ROM 1. In other words, a data writing operation and a data reading operation are effected also for the addresses assigned to the RAM 3, input/output buffer 5 and others.

When a blank check or verification is carried out, expected data are not read from the address regions other than that corresponding to the ROM 1. Thus, the comparing and checking circuit 240 in the ROM writer 200 gives the result of comparison as a "mismatch". As a result, the ROM writer 200 decides that programming is impossible, and discontinues the programming operation.

It will be appreciated that, if the ROM 1 mounted on the semiconductor storage device 100a differs in storage capacity from a general-purpose ROM, programming cannot be effected with the commercially available ROM writer 200.

When programming the above semiconductor storage device, therefore, it is necessary to use a pin-converting adapter as noted hereinbefore and to re-install software or hardware for the ROM writer to program only the address region corresponding to the built-in ROM. Alternatively, a larger tester device of higher performance than the commercially available ROM writer must be used to program only a desired address region.

Thus, the ROM writer must be re-installed or an overpriced tester device must be purchased each time the ROM in the above semiconductor storage device is programmed.

SUMMARY OF THE INVENTION

An object of this invention is to facilitate programming of a composite semiconductor storage device including a programmable memory regardless of a storage capacity.

Another object of this invention is to enable a composite semiconductor storage device including a ROM to be programmed with a commercially available programming device.

A further object of this invention is provide a readily programmable composite semiconductor storage device and a method of operating such a device.

A semiconductor storage device according to this invention includes a programmable memory, a prescribed circuit unit, a write/read circuit, a mode setting signal receiving terminal, a dummy data output circuit and a control circuit.

The programmable memory has a first address region allocated thereto. The circuit unit has a second address region different from the first address region allocated thereto. The write/read circuit is responsive to an address signal and a control signal for writing or reading a data into/from the memory or circuit unit. The mode signal receiving terminal receives a mode setting signal for designating a first operating mode or a second operating mode. The dummy data output circuit outputs a predetermined dummy data.

The control circuit activates the write/read circuit when the address signal designates the first address region or when the mode setting signal designates the first operating mode, and activates the dummy data output circuit when the address signal designates an address other than the first address region, the mode designating signal designates the second operating mode, and the control signal is in a read state.

In the first operating mode, a normal writing or reading operation may be carried out for the memory or circuit unit. In this case, a data is written to or read form the memory or circuit unit in accordance with the address signal.

In the second operating mode, the memory may be programmed using a programming device. When an address signal designating an address in the first address region is applied, a data is written to or read from the memory. When an address signal designating an address outside the first address region is applied, a predetermined dummy data is read and output. Thus, the memory may be programmed even if the programming device has a capacity different from that of the, memory.

DESCRIPTION OF THE PREFERRED EMBODIMENT

Figure 1:
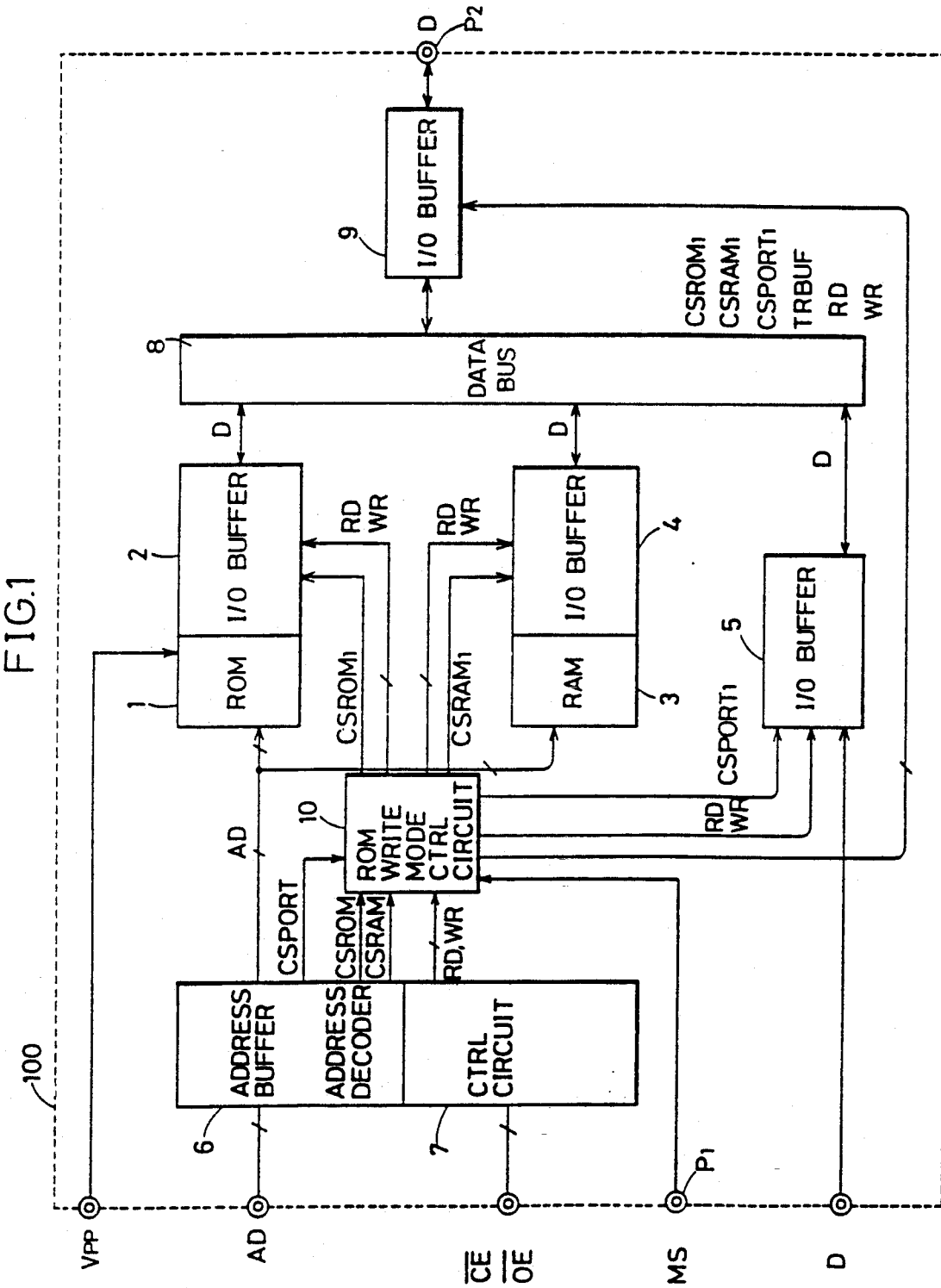
FIG. 1 is a block diagram of a semiconductor storage device in one embodiment of this invention
Figure 10:
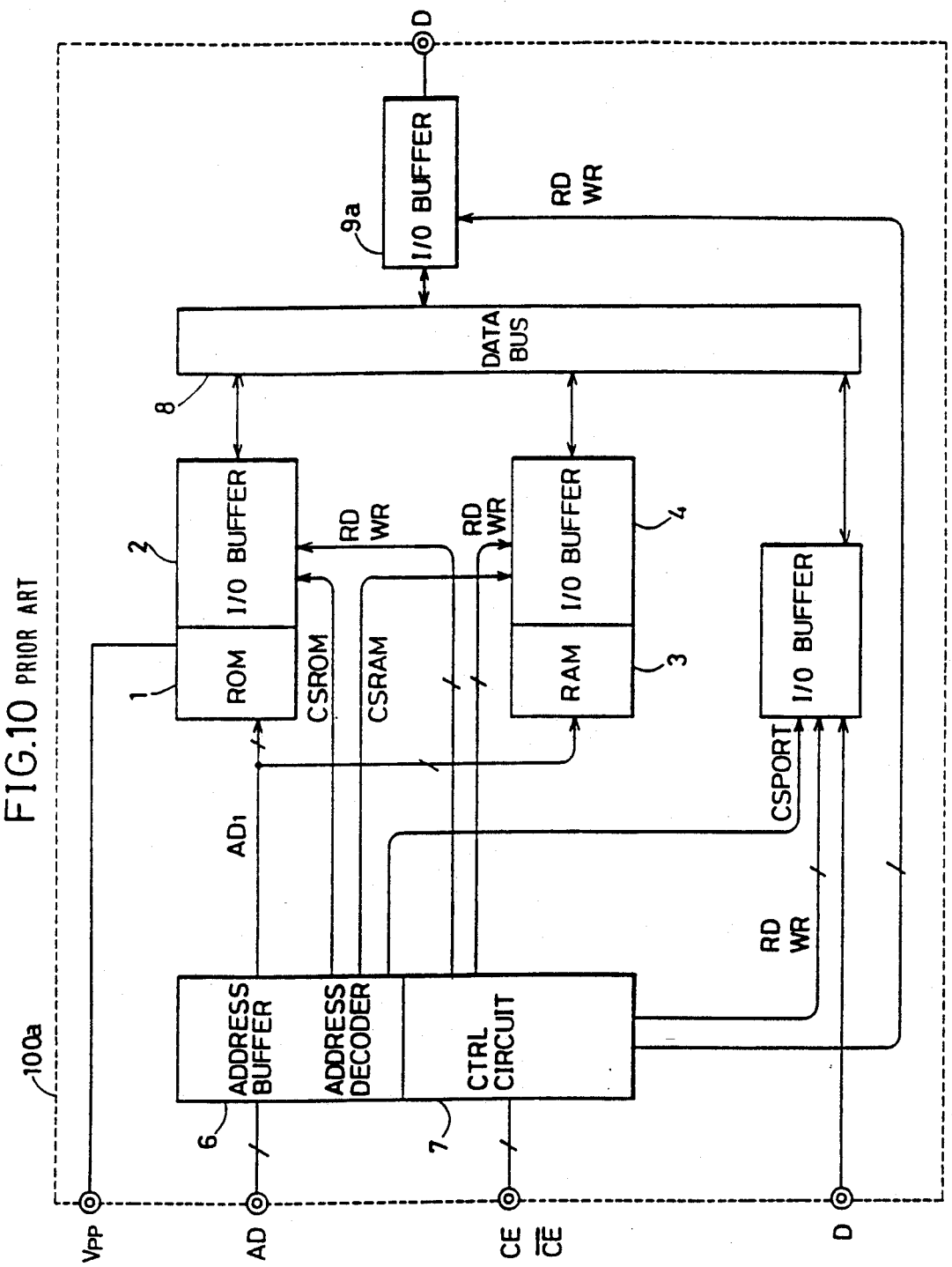
FIG. 10 is a block diagram of a conventional semiconductor storage device.
Figure 11:
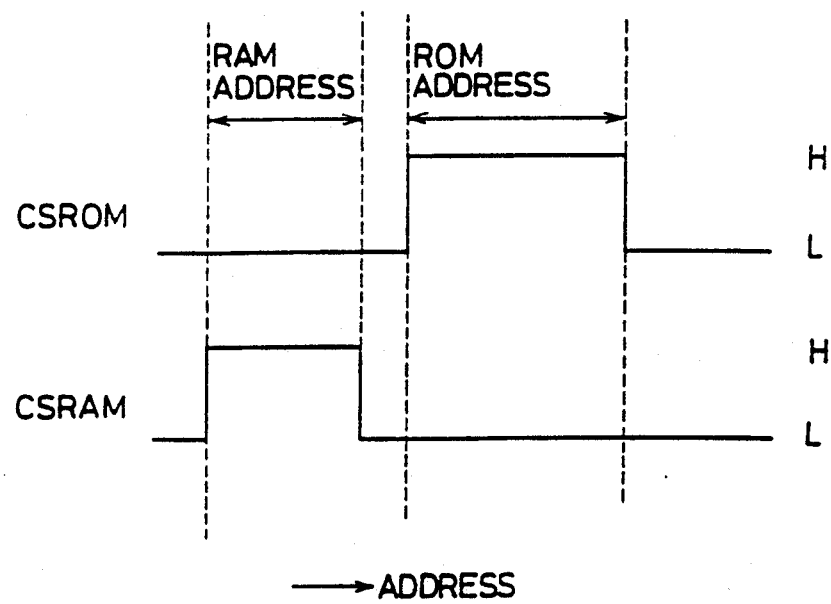
FIG. 11 is a waveform diagram for illustrating operation of the semiconductor storage device of FIG. 10.

In FIG. 1, a semiconductor storage device 100 is formed on a single chip. This semiconductor storage device 100 includes an input terminal Pl for receiving a mode setting signal MS, and a ROM write mode control circuit 10. An input/output buffer 9 differs in construction from the input/output buffer 9a in the conventional semiconductor storage device 100a shown in FIG. 10. Other components have the same constructions as in the semiconductor storage device 100a in FIG. 10.

The ROM write mode control circuit 10 receives select signals CSROM, CSRAM and CSPORT from the address buffer/decoder 6 and the mode setting signal MS from the input terminal P1, and generates select signals CSROM1, CSRAM1 and CSPORT1, and an activating signal TRBUF.

Figure 2:
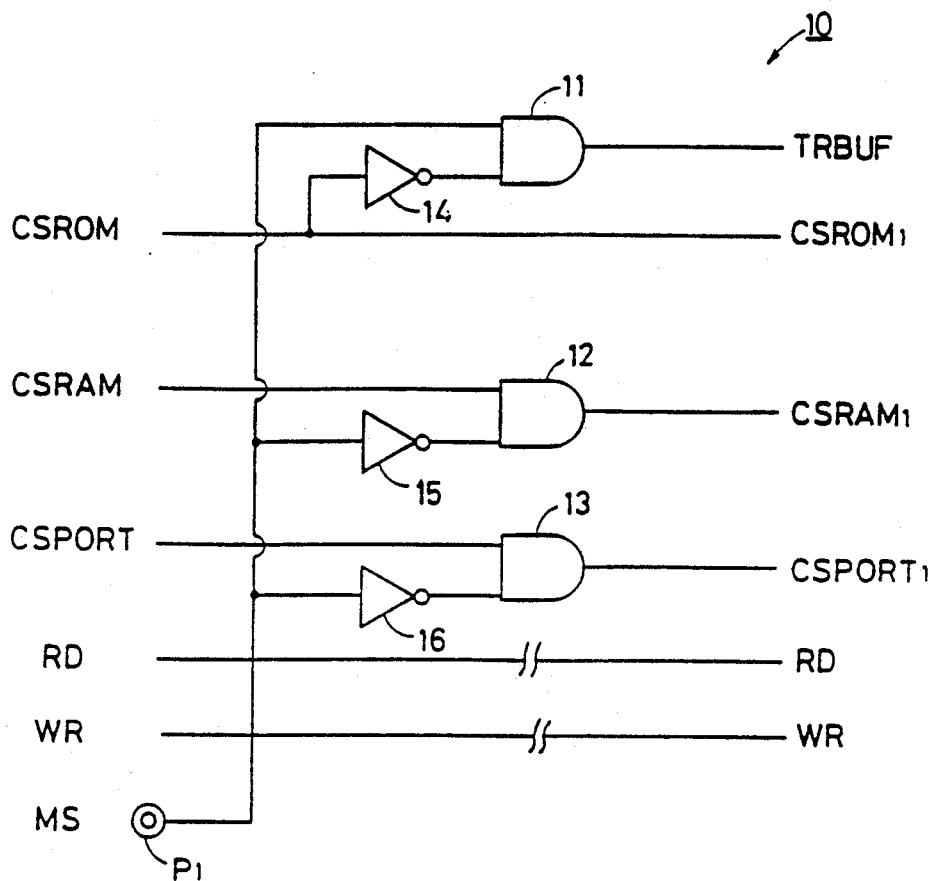
FIG. 2 is a circuit diagram showing a ROM write mode control circuit included in the semiconductor storage device of FIG. 1.

FIG. 2 is a circuit diagram showing a specific construction of the ROM write mode control circuit 10.

The ROM write mode control circuit 10 includes AND gates 11, 12 and 13 and inverters 14, 15 and 16. The AND gate 11 receives the mode setting signal MS at one input terminal thereof, and the select signal CSROM at the other input terminal through the inverter 14. The AND gate 11 outputs the activating signal TRBUF from the output terminal thereof. The select signal CSROM is output as the select signal CSROM1.

The AND gate 12 receives the select signal CSRAM at one input terminal thereof, and the mode setting signal MS at the other input terminal through the inverter 15. The AND gate 12 outputs the select signal CSRAM1 from the output terminal thereof.

The read signal RD and write signal WR are output as they are.

When the mode setting signal MS is "L" (normal mode), the activating signal TRBUF is "L" (inactive state). When, in this state, one of the select signals CSROM, CSRAM and CSPORT attains "H", a corresponding one of the select signals CSROM1, CSRAM1 and CSPORT1 attains "H".

When the mode setting signal MS attains "H" (ROM write mode), the select signals CSRAM1 and CSPORT1 attain "L" regardless of the state of the select signals CSRAM and CSPORT. If the select signal CSROM is "H", the activating signal TRBUF attains "L" and the select signal CSROM1 "H". If the select signal CSROM is "L", the activating signal TRBUF attains "H" (active state) and the select signal CSROM1 "L".

Figure 3:
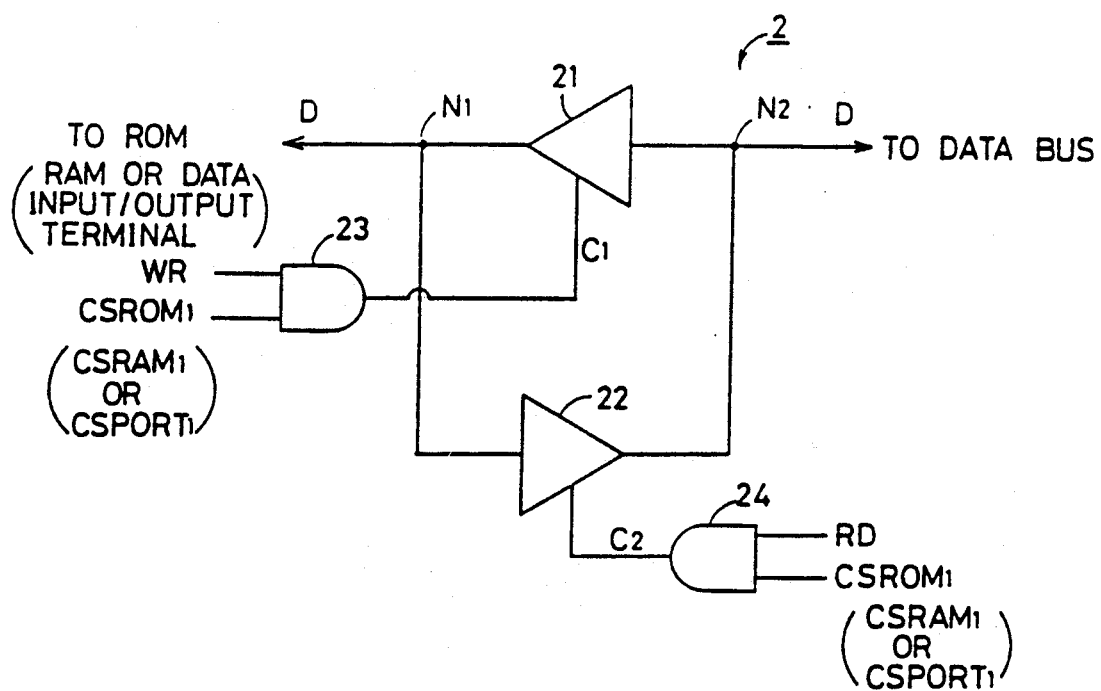
FIG. 3 is a circuit diagram showing an example of input/output buffers included in the semiconductor storage device of FIG. 1.

FIG. 3 is a circuit diagram showing a construction of the input/output buffer 2 included in the semiconductor storage device 100 shown in FIG. 1.

The input/output buffer 2 includes buffers 21 and 22 and AND gates 23 and 24. The input/output buffer 4 and input/output buffer 5 also have the same construction as shown in FIG. 3.

The buffers 21 and 22 are connected in an inverse parallel relationship between nodes N1 an N2. The write signal WR is applied to one input terminal of the AND gate 23 while the select signal CSROM1 is applied to the other input terminal thereof. In the input/output buffer 4, the select signal CSRAM1 is applied to the other input terminal of the AND gate 23. In the input/output buffer 5, the select signal CSPORT1 is applied to the other input terminal of the AND gate 23. Output of the AND gate 23 is applied as a control signal C1 to a control terminal of the buffer 21.

The read signal RD is applied to one input terminal of the AND gate 24 while the select signal CSROM1 is applied to the other input terminal thereof. In the input/output buffer 4, the select signal CSRAM1 is applied to the other input terminal of the AND gate 24. In the input/output buffer 5, the select signal CSPORT1 is applied to the other input terminal of the AND gate 24. Output of the AND gate 24 is applied as a control signal C2 to a control terminal of the buffer 22.

When the write signal WR is "H" (write state) and the select signal CSROM1 "H", the control signal C1 attains "H". As a result, the buffer 21 is activated to transmit data D from node N2 to node N1. When the read signal RD is "H" (read state) and the select signal CSROM1 "H", the control signal C2 attains "H". As a result, the buffer 22 is activated to transmit data D from node N1 to node N2. It is to be noted that the write signal Wr and read signal RD do not attain "H" at the same time.

Figures 4, 5:
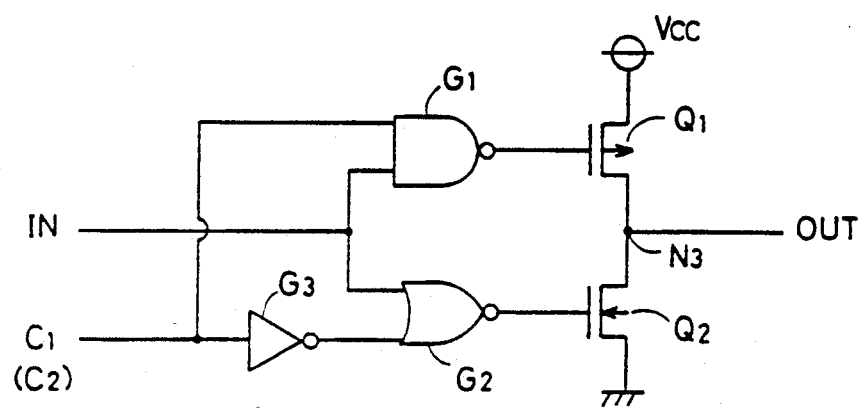
FIG. 4 is a circuit diagram showing a buffer included in the input/output buffer of FIG. 3.
FIG. 5 is a view showing a truth table for illustrating operation of the buffer of FIG. 4.

FIG. 4 is a circuit diagram showing a specific construction of the buffers 21 and 22 shown in FIG. 3.

The buffer of FIG. 4 includes a NAND gate G1, a NOR gate G2, an inverter G3, a P-channel MOS transistor Q1 and an N-channel MOS transistor Q2. The control signal C1 is applied to one input terminal of the NAND gate G1 and to one input terminal of the NOR gate G2 through the inverter G3. An input data IN is applied to the other input terminal of the NAND gate G1 and to the other input terminal of the NOR gate G2. Output of the NAND gate G1 is applied to the gate of the transistor Q1. Output of the NOR gate G2 is applied to the gate of the transistor Q2. An output data OUT is output through a node N3 which is a point of interconnection between the transistor Q1 and transistor Q2.

FIG. 5 is a truth table for illustrating operation of the buffer of FIG. 4.

As shown in FIG. 5, when the control signal C1 is "L", the output is in floating state regardless of the input data IN. When the control signal C1 is "H", the output data OUT changes dependent on the input data IN.

Figure 6:
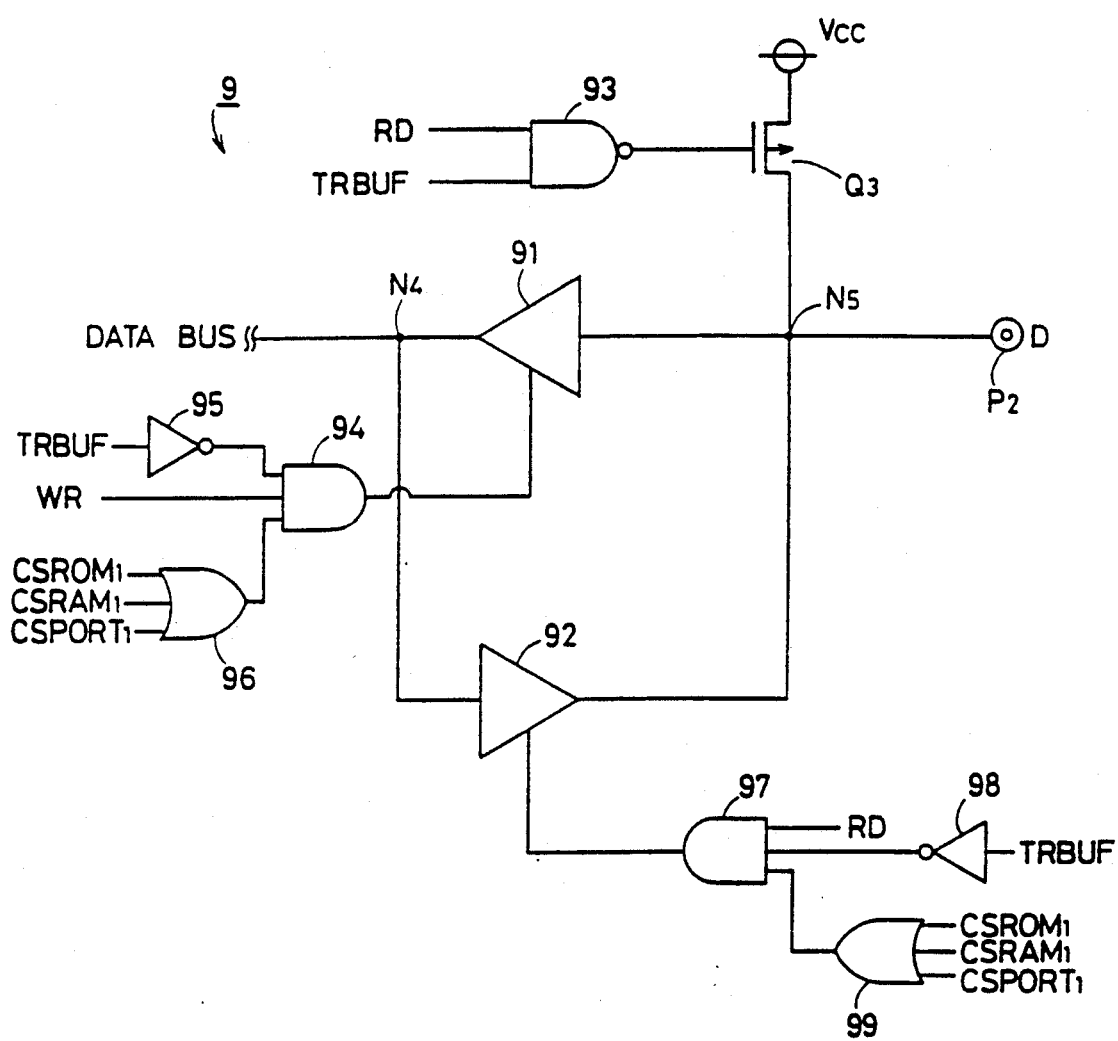
FIG. 6 is a circuit diagram showing an input/output buffer included in the semiconductor storage device of FIG. 1.

FIG. 6 is a circuit diagram showing a specific construction of the input/output buffer 9 included in the semiconductor storage device 100 of FIG. 1.

In FIG. 6, buffers 91 and 92 are connected in an inverse parallel relationship between nodes N4 and N5. The buffer 91 receives output of an AND gate 94 at a control terminal thereof. The AND gate 94 receives the activating signal TRBUF at a first input terminal thereof through an inverter 95, the write signal WR at a second input terminal, and output of a NOR gate 96 at a third input terminal. The NOR gate 96 receives the select signals CSROM1, CSRAM1 and CSPORT1 at three input terminals thereof, respectively. The buffer 92 receives output of an AND gate 97 at a control terminal thereof. The AND gate 97 receives the read signal RD at a first input terminal thereof, the activating signal TRBUF at a second input terminal through an inverter 98, and output of a NOR gate 99 at a third input terminal. The NOR gate 99 receives the select signals CSROM1, CSRAM1 and CSPORT1 at three input terminals thereof, respectively.

The node N5 is connected to a source terminal that receives a source voltage Vcc through a P-channel MOS transistor Q3. The transistor Q3 receives output of a NAND gate 93 at the gate thereof. The NAND gate 93 receives the read signal RD at one input terminal thereof, and the activating signal TRBUF at the other input terminal. The node N5 is connected also to a data input terminal P2.

The output of the AND gate 94 attains "H" when the activating signal TRBUF is "L" (non-activating state), the write signal WR is "H" (write state) and one of the select signals CSROM1, CSRAM1 and CSPORT1 is "H". As a result, the buffer 91 is activated to transmit data D from node N5 to node N4. Under other conditions, the output of the AND gate 94 becomes "L". This places the buffer 91 in inactive state. Thus, the buffer 91 is activated only at a time of writing in the normal mode.

The output of the AND gate 97 attains "H" when the activating signal TRBUF is "L" (non-activating state), the read signal RD is "H" (read state) and one of the select signals CSROM1, CSRAM1 and CSPORT1 is "H". As a result, the buffer 92 is activated to transmit data D from node N4 to node N5. Under other conditions, the output of the AND gate 97 attains "L". This places the buffer 92 in inactivated state. Thus, the buffer 92 is activated only at a time of reading in the normal mode.

On the other hand, the output of the NAND gate 93 attains "L" when the read signal RD is "H" (read state) and the activating signal TRBUF is "H" (activated state). As a result, the transistor Q becomes conductive. This changes the potential of node N5 to "H". Under other conditions, the output of the NAND gate 93 attains "H". This maintains the transistor Q3 in nonconductive state. Thus, a control is effected to turn the transistor Q3 to conductive state only at a time of reading in the ROM write mode. As a result, the data input-/output terminal P2 outputs a dummy data in "H" level.

Figure 7:
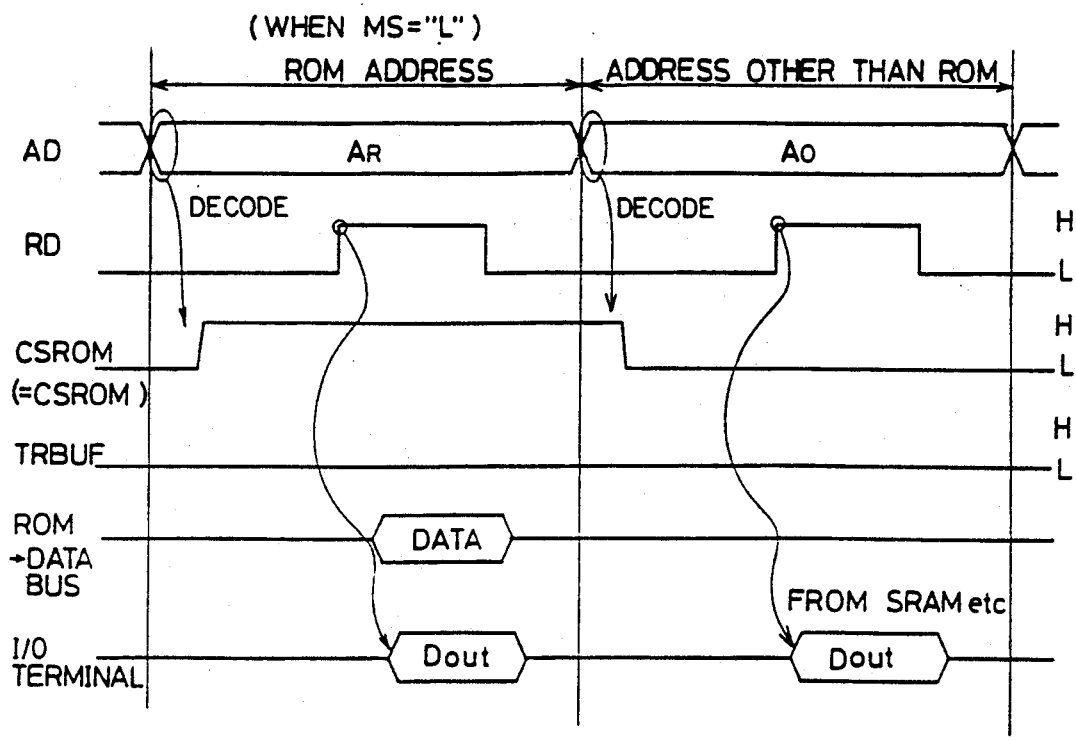
FIGS. 7 and 8 are timing charts for illustrating operation of the semiconductor storage device of FIG. 1.

The way in which the semiconductor storage device 100 of FIG. 1 operates will be described next with reference to timing charts of FIGS. 7 and 8.

Figure 8:
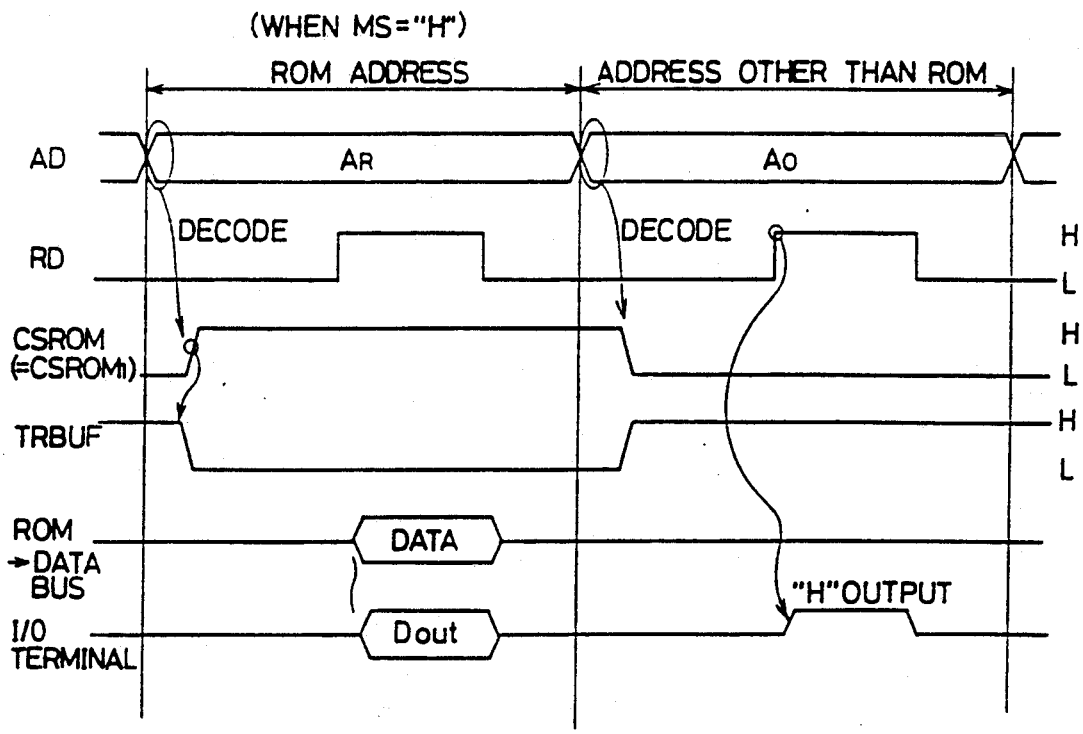

FIG. 8 is a timing chart showing a reading operation carried out when the mode setting signal MS is "L" (normal mode).

Upon receipt of the address signal AD applied externally, the address buffer/decoder 6 decodes the address signal AD. When the address signal AD shows an address AR in the address region corresponding to the ROM 1, the select signals CSROM and CSROM1 attain "H". As a result, the input/output buffer 2 becomes operable. On the other hand, the activating signal TRBUF is fixed to "L" in the ROM write mode control circuit 10. When the read signal RD attains "H", the input/output buffers 2 and 9 change to an output enable state. As a result, a data is read from the ROM 1 and transmitted to the data bus 8. The data on the data bus 8 is output through the input/output buffer 9 and out from the data input/output terminal P2.

When the address signal Ad shows an address AO in the address region corresponding to the RAM 3 or input/output buffer 5, the select signal CSRAM1 or CSPORT1 attains "L". As a result, the input/output buffer 4 or input/output buffer 5 becomes operable. In this case too, the activating signal TRBUF is constantly fixed to "L". When the read signal RD attains "H", the input/output buffers 4 or input/output buffer 5 and input/output buffer 9 change to the output enable state. As a result, a data is read from the RAM 3 or input/output buffer 5 and transmitted to the data bus 8. The data on the data bus 8 is output through the input/output buffer 9 and out from the data input/output terminal P2.

When the address signal AD designates an address outside the address regions corresponding to the ROM 1, RAM 3 and input/output buffer 5, none of the select signals CSROM1, CSRAM1 and CSPORT1 attain "H". Consequently, nothing is output from the data input/output terminal P2.

In the above described normal mode, transistor Q3 in input/output buffer 9 shown in FIG. 6 is always kept off.

FIG. 8 is a timing chart showing a reading operation carried out when the mode setting signal MS is "H" (ROM write mode).

Upon receipt of the externally applied address signal AD, the address buffer/decoder 6 decodes the address signal AD. When the address signal AD denotes an address AR in the address region corresponding to the ROM 1, the select signals CSROM and CSROM1 attain "H". As a result, the input/output buffer 2 becomes operable. At this time, the activating signal TRBUF is in opposite phase to the select signal CSROM1. In other words, the activating signal TRBUF changes to "L". When the read signal RD attains "H", the input/output buffers 2 and 9 change to the output enable state. As a result, data is read from the ROM 1 and output through the data bus 8 and input/output buffer 9 and out from the data input/output terminal P2.

When the address signal AD shows an address AO outside the address region corresponding to the ROM 1, the select signal CSROM1 becomes "L". On the other hand, one of the select signals CSRAM1 and CSPORT1 may attain "H". However, the activating signal TRBUF attains "H" (activating state). This renders inoperable the buffers 91 and 92 in the input/output buffer circuit 9 shown in FIG. 6. Since the activating signal TRBUF is at "H" level, the transistor Q attains conductive when the read signal RD changes to "H". As a result, the data input/output terminal P2 outputs a dummy data in "H" level.

At a time of writing in the normal mode, the input-/output buffers 2 and 4 or input/output buffers 5 and 9 are set to the input enable state. Consequently, externally applied data D is written into the ROM 1, RAM 3 or input/output buffer 5 in accordance with the address signal AD applied externally.

A writing operation carried out in the ROM write mode will be described next.

When the address signal AD denotes an address in the address region corresponding to the ROM 1, the input/output buffers 2 and 9 become operable. Consequently, externally applied data D is written into the ROM 1 in accordance with the address signal AD.

When the address signal AD denotes an address outside the address region corresponding to the ROM 1, the buffers 91 and 92 in the input/output buffers 9 shown in FIG. 6 become inactive. Consequently, the data D applied externally to the input/output terminal P2 is not written to any one of the ROM 1, RAM 3 and input/output buffer 5.

In the foregoing embodiment, the ROM 1 corresponds to the programmable memory means, and the RAM 3 and input/output buffer 5 to the circuit means.

Figure 9:
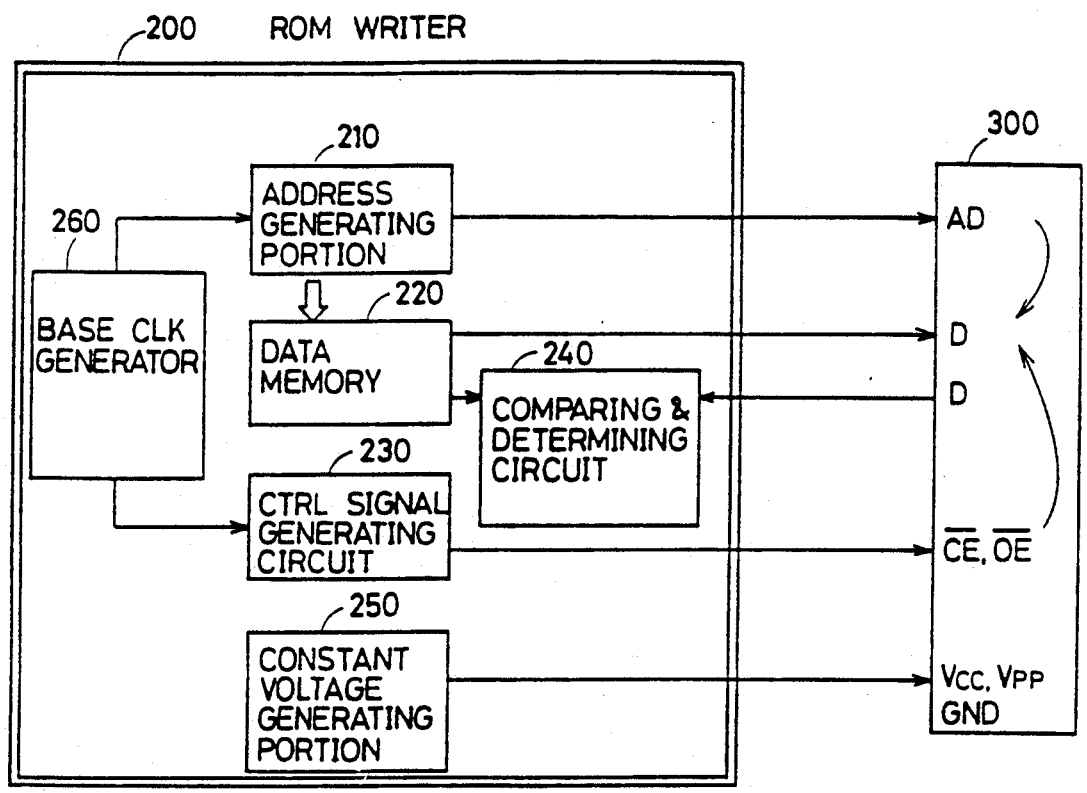
FIG. 9 is a diagram illustrating programming using a commercially available ROM writer.

The transistor Q3 in the input/output buffer 9 shown in FIG. 9 corresponds to the dummy data output means. Further, ROM write mode control circuit 10 and the NAND gate 93 in the input/output buffer 9 correspond to the control means.

As described above, when an address signal denoting an address outside the address region corresponding to the ROM 1 is applied at a time of reading in the ROM write mode, a dummy data in "H" level is output from the input/output terminal P2. When an address signal denoting an address outside the address region corresponding the ROM 1 is applied at a time of writing in the ROM write mode, the input/output buffer 9 becomes inoperable.

At a time of the ROM write mode, therefore, "H" level data are set to the ROM writer as expected value data and as writing data corresponding to the address regions other than the address region for the ROM 1. Consequently, dummy data in "H" level are obtained as reading data, although data are actually written only into the ROM 1 in the semiconductor storage device 100. It seems to the ROM writer as if data were properly written into the address regions other than the region assigned to the ROM 1.

Thus, even if the ROM 1 in the semiconductor storage device 100 has a storage capacity different from that of a general-purpose ROM, the ROM 1 may be programmed using a commercially available ROM writer as shown in FIG. 9.

According to the above embodiment, where the address regions provided in the semiconductor storage device 100 correspond to the address regions in an appropriate general-purpose ROM, with the address region for the ROM 1 included in the address regions in the general-purpose ROM, the same write control may be realized for the semiconductor storage device 100 as for the general-purpose ROM by selecting a write mode and a read mode common to the ROM 1 and general-purpose ROM.

In the foregoing embodiment, the RAM 3 and input/output buffer 5 are shown as examples of the circuit device. However, the circuit device may have other memory structures and circuit structures. The ROM 1 may be an EPROM, EEPROM or other programmable memory.

Further, the ROM write mode control circuit 10 and input/output buffer 9 are not limited to the described constructions. For example, the transistor Q3 shown in FIG. 9 may be replaced with an N-channel MOS transistor connected to a ground terminal. IN this case, dummy data are output in "L" level.

According to the present invention, as described above, a programmable memory included in a semiconductor storage device may readily be programmed using a commercially available programming device even if this programmable memory has a capacity different from that of the commercially available programming device.

What is claimed is:

1. A semiconductor storage device comprising:
  programmable memory means having a first address region allocated thereto,
  circuit means having allocated thereto a second address region different from said first address region,
  write/read means responsive to an address signal and a control signal designating a read or write operation for writing or reading data into/from said memory means or said circuit means,
  mode signal receiving means for receiving a mode setting signal designating a first operation mode or a second operation mode,
  dummy data output means for outputting a predetermined dummy data, and
  control means for activating said write/read means when said address signal designates said first address region or when said mode setting signal designates said first operating mode, and activating said dummy data output means when said address signal designates an address outside said first address region, said mode setting signal designates said second operating mode, and said control signal designates said read operation.

2. A semiconductor storage device according to claim 1, wherein said programmable memory means includes a read only memory.

3. A semiconductor storage device according to claim 2, wherein said circuit means includes a random access memory.

4. A semiconductor storage device according to claim 2, wherein said circuit means includes an input/output port.

5. A semiconductor storage device according to claim 2, wherein said first operating mode includes a normal read/write mode, and said second operating mode includes a read only memory write mode.

6. A semiconductor storage device according to claim 1, wherein said programmable memory means, said circuit means, said write/read means, said mode setting signal receiving means, said dummy data output means and said control means are formed on a single chip.

7. A semiconductor storage device according to claim 1, wherein said control means includes:
  decode means for decoding said address signal, and selectively outputting a select signal for selecting said programmable memory means or a second select signal for selecting said circuit means,
  first signal generating means for generating a first control signal in response to said first select signal or said mode setting signal designating said first operating mode, and generating a second control signal in response to said second select signal and said mode setting signal designating said second operation mode,
  second signal generating means for generating a second control signal in response to said second select signal and said mode setting signal designating said first operating mode,
  third signal generating means for generating an activating signal for activating said dummy data output means in response to said second control signal and said control signal designating said read operation, and
  fourth signal generating means for generating an activating signal for activating said write/read means in response to said first control signal and said first or second select signal.

8. A semiconductor storage device according to claim 7, wherein said write/read means includes input/output buffer means and a data input/output terminal controllable by said second control signal.

9. A semiconductor storage device according to claim 8, wherein said dummy data output means includes:
  switch means connected between a predetermined source potential and said data input/output terminal and having a control terminal for receiving said first control signal.

10. A semiconductor storage device according to claim 9, wherein said switch means includes a field effect transistor.

11. A method of operating an on-chip semiconductor storage device including programmable memory means having a first address region allocated thereto, circuit means having a second address region different from said first address region allocated thereto, and write/read means responsive to an address signal and a control signal designating a read or write operation for writing or reading data into/from said memory means or said circuit means, said method comprising the steps of:

receiving a mode setting signal for designating a first operating mode or a second operating mode, activating said write/read means when said address signal designates said first address region or when said mode setting signal designates said first operating mode, and outputting a dummy data when said address signal designates an address outside said first address region, said mode setting signal designates said second operating mode, and said control signal designates said read operation.

* * * * *

UNITED STATES PATENT AND TRADEMARK OFFICE
CERTIFICATE OF CORRECTION

PATENT NO. : 5,233,561
DATED : August 3, 1993
INVENTOR(S) : Shinichi MORI et al.

It is certified that error appears in the above-identified patent and that said Letters Patent is hereby corrected as shown below:

Column 2, line 3, change "SPROM" to --SRAM--.

Signed and Sealed this

Twenty-fourth Day of May, 1994

Attest:

BRUCE LEHMAN

Attesting Officer      Commissioner of Patents and Trademarks